United States Patent [19]
Swarup

[11] Patent Number: 5,929,729
[45] Date of Patent: Jul. 27, 1999

[54] PRINTED LUMPED ELEMENT STRIPLINE CIRCUIT GROUND-SIGNAL-GROUND STRUCTURE

[75] Inventor: Arvind Swarup, Kitchener, Canada

[73] Assignee: COM DEV Limited, Canada

[21] Appl. No.: 08/957,295

[22] Filed: Oct. 24, 1997

[51] Int. Cl.⁶ .............................. H01P 3/08; H03H 7/00; H01F 5/00; H05K 1/16
[52] U.S. Cl. .......................... 333/246; 333/116; 333/185; 336/200; 361/761; 361/763
[58] Field of Search ..................... 333/128, 116, 333/118, 185, 238, 246, 167; 336/200; 361/303, 313, 320, 321.1, 321.2, 321.3, 738, 748, 761, 763–766, 784, 792, 795, 821

[56] References Cited

U.S. PATENT DOCUMENTS

| | | | |
|---|---|---|---|
| 5,039,965 | 8/1991 | Higgins, Jr. ......................... | 333/185 X |
| 5,105,172 | 4/1992 | Khatibzadeh et al. .............. | 333/185 X |
| 5,307,045 | 4/1994 | Senda et al. ............................ | 361/200 |
| 5,311,406 | 5/1994 | Snodgrass et al. .................. | 333/238 X |
| 5,359,315 | 10/1994 | Inoue et al. ............................. | 336/200 |
| 5,382,925 | 1/1995 | Hayashi et al. ..................... | 333/116 X |
| 5,396,397 | 3/1995 | McClanahan et al. ............. | 361/795 X |
| 5,467,064 | 11/1995 | Gu ........................................ | 333/238 X |
| 5,489,880 | 2/1996 | Swarup .................................... | 333/128 |
| 5,636,099 | 6/1997 | Sugawara et al. .................. | 361/763 X |
| 5,783,976 | 7/1998 | Furutani et al. ..................... | 333/246 X |

*Primary Examiner*—Robert Pascal
*Assistant Examiner*—Barbara Summons
*Attorney, Agent, or Firm*—Jones, Day, Reavis & Pogue

[57] ABSTRACT

A novel circuit packaging structure including a combination of printed lumped elements within a multi-layer stripline architecture is provided and methods of making the same. The lumped elements are provided by printing the individual passive elements, including interdigital capacitors and spiral inductors, onto the supporting substrate and then embedding these elements into the multi-layer stripline structure. The stripline structure consists of a signal layer sandwiched between at least two ground layers separated by two dielectric substrates of equal thickness. This ground-signal-ground approach confines the electromagnetic fields within the multi-layer structure, thereby minimizing radiation from coupling to nearby components. This approach offers a unique combination of stripline technology and printed lumped elements resulting in miniaturized radio frequency and microwave circuits at operating at frequencies well below 1 GHz, up to several GHz.

23 Claims, 9 Drawing Sheets

PRINTED LUMPED ELEMENT STRIPLINE CIRCUIT GROUND-SIGNAL-GROUND STRUCTURE

BACKGROUND OF THE INVENTION

The present invention is directed toward the field of radio frequency (RF) or microwave signal-carrying circuits. In particular, the invention discloses a printed lumped element stripline architecture for implementing various RF passive circuits. The application describes in detail two exemplary circuits, a −3 dB three-port coupler and a 90° branch line four-port coupler, although the invention can be extended to any type of passive circuit. The invention also discloses methods of making the stripline architecture that includes the printed circuits. The novel stripline structure provides a ground-signal-ground multi-layer architecture in which the signal carrying circuit is printed on a first dielectric substrate, and additional dielectric substrates are laminated on opposite sides of the first substrate, each additional substrate having a ground plane on a side opposite the printed circuit side of the first substrate. By printing lumped elements to form the desired circuit within a multi-layer stripline architecture, the present invention overcomes many disadvantages associated with prior and current circuit packaging techniques.

The present invention finds its greatest utility in space-based communication satellites. However, the techniques and circuit architecture disclosed herein are not limited to use in communication satellites and can be extended to other applications. Satellites typically employ many signal carrying circuits, such as power splitters/combiners (i.e. couplers), switch matrices, local oscillator distribution networks, and corporate feed networks for phased arrays, to name a few. Each of these circuits may include several passive components, such as resistors, inductors and capacitors. Reducing the size, mass, cost and electromagnetic radiation associated with these circuits is of critical importance to the satellite industry and requires careful design of the circuit structure and packaging.

Present methods of making RF/Microwave circuits for the satellite industry include the following techniques: (1) printing distributed element transmission lines to form the particular circuit; (2) implementing discrete lumped-element circuits; and (3) printing exposed microstrip lumped elements. Each of these techniques suffers from several disadvantages.

According to the first method (printing distributed transmission lines that form the individual components of the circuit) a certain length of metal line is printed onto a substrate. The transmission line is modeled as a continuous chain of capacitors, inductors and resistors (series and shunt) along the length of the transmission line. To provide a circuit element having particular electrical characteristics, transmission lines of varying lengths (which are computed as a function of frequency) and line widths (which define the impedance) are networked into a specific geometry. This geometry is then printed onto a substrate to form the particular circuit element, or is etched into a substrate that has been metallized.

This first method suffers from several disadvantages. First, because the length of line required to model a particular element is dependant upon the wavelength of the signal being propagated, the technique is not useful at frequencies below about 1 GHz. As the propagation frequency decreases, the associated wavelength of the signal increases, and therefore the line lengths necessary to provide the needed functional elements become too large. This increases the size of the resultant circuit for most applications, and is impractical for space communication satellites. In addition, if the desired operating bandwidths are large, the size of the circuit increases even further since the number of network sections increases. For space-based communication applications, where operating bandwidths of several hundred MHz to several GHz are common, and where space and weight are at a premium, this technique is undesirable.

The second method (providing discrete lumped-element circuits) does not involve printing elements onto a substrate. This technique requires hand soldering and assembly of individual discrete lumped elements onto the signal carrying substrate. If a particular circuit is required to use certain passive components, then these components—capacitors, inductors, resistors, etc.—are procured and are directly assembled onto the substrate using surface-mount technology, just like any conventional printed circuit board.

This technique suffers from many disadvantages, such as: (1) it requires the procurement of individual components that must be assembled onto the substrate, therefore requiring time consuming and expensive handling and manufacturing procedures; (2) for space-based communication applications, it requires the procurement of expensive mil-spec or space-qualified components that may have to be tested in-house before integration into the substrate; (3) it requires human intervention to assemble the discrete components, inevitably leading to lower quality and enhanced defects; and (4) circuits designed using discrete components are generally limited to an upper frequency of 1 GHz, due to the physical size of the discrete components that become comparable to the wavelength of the signal frequency, resulting in distortion of their individual characteristics.

The third method is printing microstripline lumped elements. An example of a microstripline lumped element circuit is shown in U.S. Pat. No. 5,489,880 (the "'880 patent") to Swarup, assigned to the assignee of the present invention. The teaching of this commonly owned patent is incorporated herein by reference. As seen in the '880 patent, a microstripline architecture is an open structure in which a conductor pattern is printed or etched on top of a substrate. Lumped elements, such as interdigital capacitors and inductors are printed in metallized form onto the substrate layer. The microstripline approach is very common in Monolithic Microwave Integrated Circuits (MMIC.) This structure consists of a ground-substrate-signal architecture, with the signal layer exposed to the atmosphere above the substrate. The substrate material is typically an expensive GaAs substrate.

The primary disadvantage of the microstripline approach, particularly for space-based communication applications, is electromagnetic radiation from the circuit. Because the microstripline architecture is open on the top, where the high frequency signals are being propagated, such a structure can radiate these signals into the space above the substrate, potentially coupling the signals from the substrate to physically adjacent components and circuits. This creates cross-talk between the microstripline circuit and adjacent circuits, which degrades the functionality of the satellite payload. Therefore, it is undesirable to package other circuits or elements close to the top of the microstripline substrate, since signal noise may be radiated onto these other elements. This is a serious disadvantage of the microstripline approach in satellite applications, where size and packaging are key constraints. Another disadvantage of this approach is the use of expensive GaAs substrate materials, and the fact that such designs are only economically when large production quantities (thousands) are involved. Therefore, this technique is not cost effective for small numbers of units, which is typical in the satellite field where only a few number of specialized circuits may be required.

Therefore, there remains a need in this art for a lumped element stripline circuit having an architecture that suppresses radiation from the signal layer from coupling to adjacent circuits, and allows for integration of multifunctional elements, e.g., digital logic, IF, RF, Microwave, etc., within a single package.

There remains yet an additional need for such an architecture that can be used to implement various circuits, such as power splitters/combiners, solid state switch matrices, corporate feed networks, filters, couplers, etc.

There remains a need in this art for a method of making a lumped element stripline circuit having a ground-signal-ground architecture that suppresses radiation from the signal layer by sandwiching the signal layer between at least two ground layers.

There remains yet an additional need for such a method where numerous laminates are placed on either side of the signal carrying layer so as to define a stripline structure.

There remains a more general need for a method of making a lumped element stripline circuit that is low cost, is small in size, is easy to manufacture, does not radiate to adjacent circuits, is highly integrateable, and can be extended to many circuit implementations.

There remains a more particular need for a printed lumped element stripline packaging method for use with signal carrying circuits that can be cheaply and easily integrated into a satellite payload without concern that the circuit will create electromagnetic cross-talk to adjacent circuits.

There remains an additional need for such a packaging method that uses commercially available soft substrates that are laminated together to form a ground-signal-ground structure that prohibits radiation.

There remains a further need in this area for a printed lumped element circuit structure that can be used to implement specific passive circuits that operate from several hundred MHz up to several GHz.

SUMMARY OF THE INVENTION

The present invention overcomes the problems noted above and satisfies the needs in this field for a lumped-element stripline circuit structure and method of making the same. The invention provides a novel multi-layer stripline circuit structure, and method of making the structure that is particularly useful for the satellite industry, although the structures, techniques and methods disclosed can be applied to other fields.

Design constraints imposed by the satellite industry to reduce cost, mass and size, while at the same time maintaining high electrical performance for next generation satellite systems, provided an incentive to explore alternative packaging and implementation technologies to the prior techniques noted above. This incentive led to the present invention, which provides a combination of printed lumped elements within a multi-layer stripline architecture that results in numerous advantages over the prior techniques of designing and packaging signal carrying circuits. The lumped elements are created by printing the individual passive elements, including interdigital capacitors and spiral inductors, onto the supporting substrate and then embedding these circuits into the multi-layer stripline structure. The stripline structure consists of a signal carrying layer sandwiched between at least two ground planes separated by two dielectric layers of approximately equal thickness. This "ground-signal-ground" approach confines the electromagnetic fields generated by the signal layer within the multi-layer structure, thereby minimizing radiation from coupling to nearby components. This approach offers a unique combination of stripline technology and printed lumped elements that results in miniaturized RF/microwave circuits that can operate at frequencies well below 1 GHz, up to several GHz.

As an example, this application discloses the implementation and design of two types of power circuits, a three-port coupler (commonly known as a power divider/combiner circuit) and a four-port coupler (commonly known as a quadrature coupler.) These circuits are designed in the multi-layer stripline architecture. The three-port coupler is used to split input signal power, incident on an input port, into two equi-phase, equi-amplitude signal levels delivered to loads at two output ports. The coupler is a reciprocal device, and therefore performs power combining in the opposite direction. Also described herein is a four-port coupler. Although the present invention is being described in terms of these two power splitters/combiners, it is to be understood that the present invention is not limited to these types of circuits, but can be extended to any type of printed lumped element circuit, including, but not limited to filters, couplers, switch matrices, corporate feed networks, local oscillator distribution networks, etc.

The method of the present invention relates to the packaging of a circuit using the stripline architecture according to the steps of: (a) providing a first dielectric substrate that may include resistive material embedded within it; (b) metallizing both sides of the first substrate; (c) printing a signal pattern onto a signal side of the first substrate, the pattern corresponding to the particular circuit to be implemented; (d) etching the patterned substrate to remove the metallized material that does not correspond to the circuit elements; (e) laminating a second substrate on top of the signal side of the first substrate; (f) drilling via holes through the second substrate to contact metallized via pads printed on the signal layer; (g) metallizing the top of the second substrate, including the inside of the drilled via holes; (h) printing a bridge pattern onto the metallized top of the second substrate; (i) etching the bridge pattern to form a dielectric bridge connecting various components printed on the signal layer of the first substrate; (j) laminating a third substrate on top of the second substrate; and (k) metallizing the top of the third substrate. Additional laminates, signal layers, via holes, and ground planes can be implemented by laminating, metallizing and etching additional substrates.

The present invention provides numerous advantages over the prior techniques, particularly when the lumped element circuit is to be used in a satellite application. These advantages include: (1) reduced mass and size over distributed transmission line techniques due to the lumped element approach; (2) reduction in signal radiation, coupling and cross-talk to nearby circuits due to the ground-signal-ground stripline architecture; (3) increased ability to integrate with other components due to the reduction in signal radiation; (4) less handling of components and ease of manufacture compared to the discrete lumped element approach; (5) eliminates the need to purchase space-qualified components; (6) reduction in manufacturing cost due to elimination of procuring discrete components and related assembly operations; and (7) operation at well below 1 GHZ up to several GHz, without the frequency dependancies associated with the distributed transmission line methods.

These are just a few of the many advantages of the present invention, as described in more detail below. As will be appreciated, the invention is capable of other and different embodiments, and its several details are capable of modifications in various respect, all without departing from the spirit of the invention. Accordingly, the drawings and description of the preferred embodiment are to be regarded as illustrative in nature and not restrictive.

BRIEF DESCRIPTION OF THE DRAWINGS

The present invention satisfies the needs noted above as will become apparent from the following description when read in conjunction with the accompanying drawings wherein.

DETAILED DESCRIPTION OF THE DRAWINGS

Figure 1:
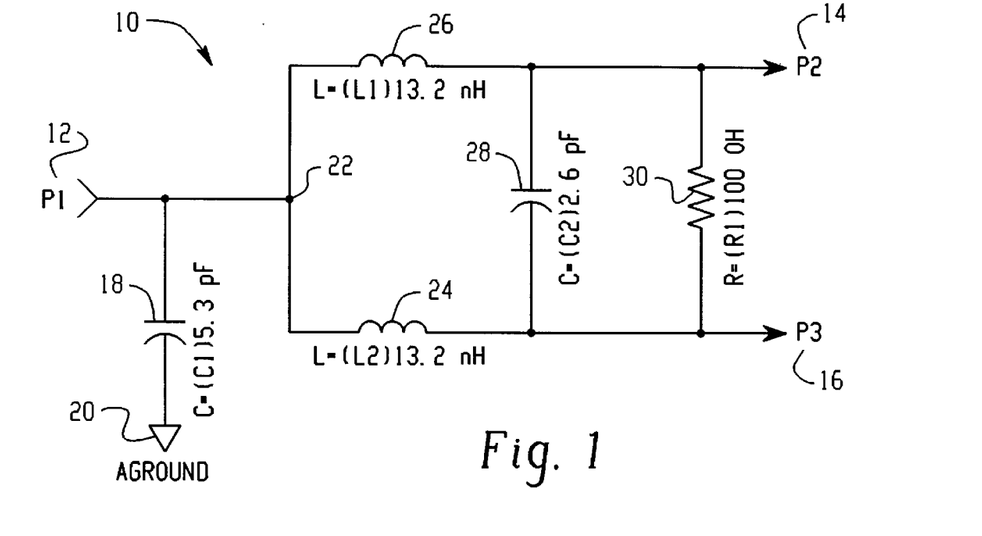
FIG. 1 is a circuit schematic of a three-port coupler.
Figure 7A:
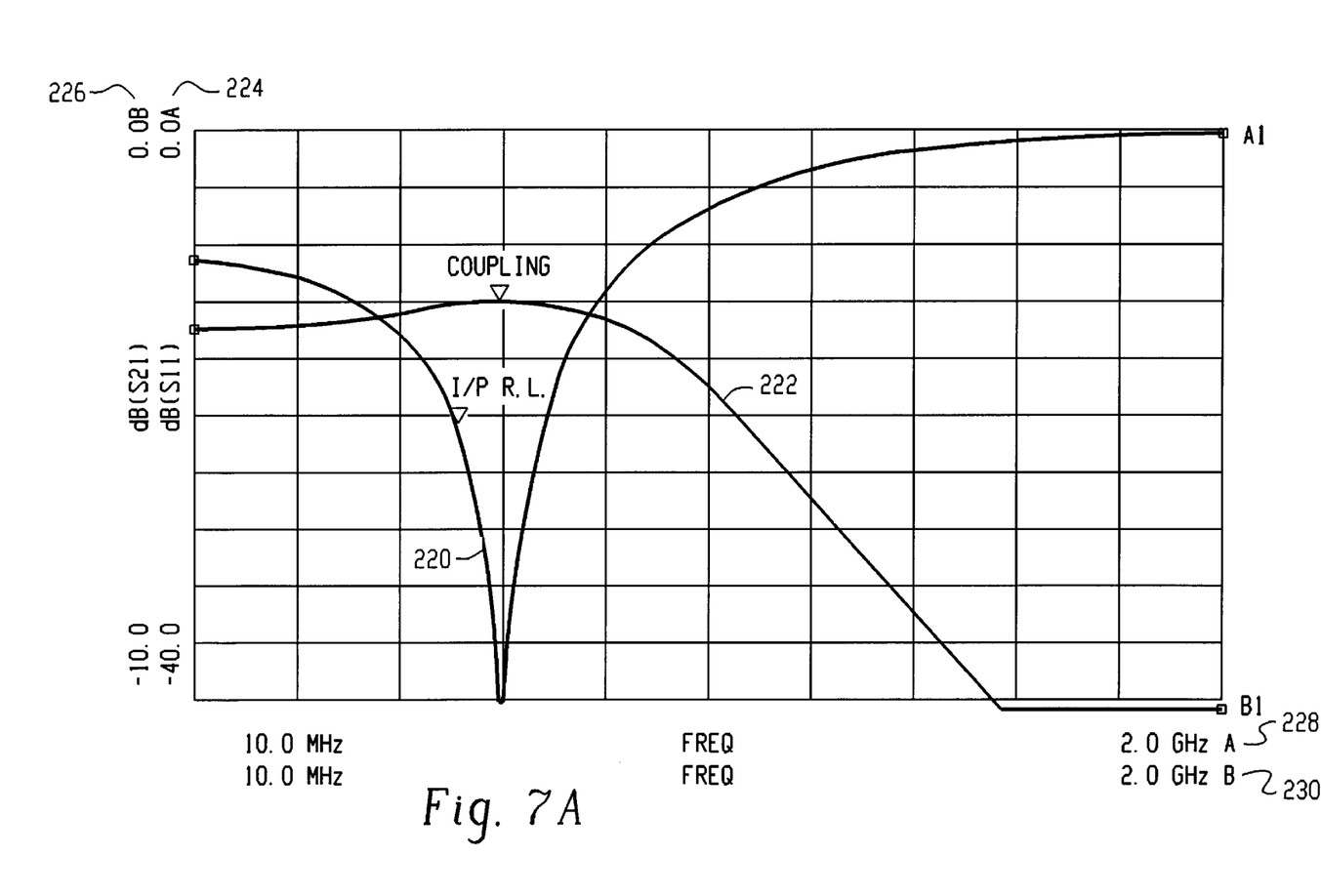
FIG. 7A is a plot of the frequency response of an ideal three-port coupler as set forth in FIG. 1.

Turning now to the drawings, FIG. 1 sets forth a circuit schematic of a three-port coupler 10 to be constructed according to the architecture and method of the present invention. The three-port coupler 10 includes three ports, one input port (P1) 12 and two output ports (P2, P3) 14, 16. The three-port coupler is a power splitter in one direction—from input to output—and a combiner in the opposite direction—from output to input. Hence this device is also referred to as a splitter/combiner. The transmission loss through the splitter/combiner is ideally −3 dB, as seen in FIG. 7A.

The input and output ports 12, 14, 16 are balanced stripline transmission lines and represent the only distributed section of the design, described more fully below. FIG. 1 shows a single section of the coupler, although in practice the design generally would comprise several sections connected together, depending on the operating bandwidth. A single section of the design constitutes two quarterwave transmission sections having an impedance of √2* Zo (where Zo represents the input and output port load impedance.) In a lumped approach, as described in the present invention, the quarterwave sections of the coupler 10 can be represented by either a lumped "PI" network or a lumped "L" network. The lumped network provides the necessary phase shift and impedance transformation to satisfy the functional requirements of the coupler. The lumped "PI" network (not shown) includes a capacitor to ground connected to each of the input and output ports, with an inductor between the two ports, thus forming a "PI" configuration. The lumped "L" network is more simple, including a capacitor connected between the output port and signal ground, and a series inductor between the two ports. Although either configuration could be used to design the coupler, FIG. 1 uses an "L" network on each of the coupled paths, from input port (P1) 12 to a first output port (P2) 14, and from the input port (P1) 12 to a second output port (P3) 16.

The −3 dB three-port coupler 10 includes a shunt capacitor 18 connected between the input port (P1) 12 and analog ground 20, followed by a "TEE" junction 22. The two side ports of the TEE junction 22 are connected to series inductors 24, 26. A balancing network consisting of a capacitor 28 and resistor 30 is connected between the two output ports (P2) and (P3), 14, 16. The balancing network provides the isolation between the various ports.

As one of ordinary skill in the art would recognize, the elemental values of capacitors 18 and 28, inductors 26 and 24 and resistor 30, can be selected to achieve the desired frequency response and isolation response of the coupler 10. In order to achieve the ideal frequency response set forth on FIG. 7A, discussed in more detail below, the preferred values for the elements are as follows: shunt capacitor 18=5.3 pF; inductors 24, 26=13.2 nH; balancing capacitor 28=2.6 pF; and balancing resistor 30=100 ohms. Of course, alternative values can be substituted for these preferred values in order to provide a coupler with an alternative frequency response and isolation characteristic.

Figure 2:
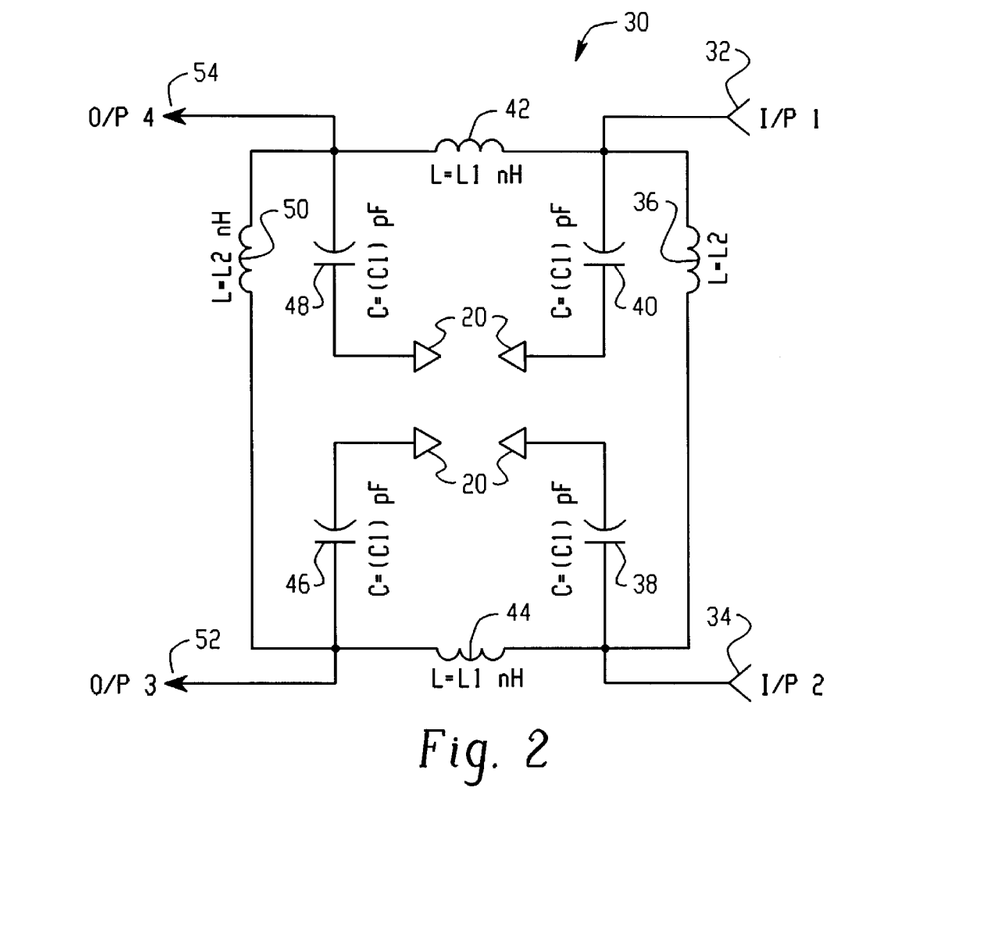
FIG. 2 is a circuit schematic of a four-port coupler.

Referring now to FIG. 2, a four-port 90° branch line coupler 30 is set forth. As noted above, these coupler circuits (FIG. 1 and 2) are being set forth to demonstrate an example of the types of circuits that can be implemented according to the novel stripline architecture and method of the present invention. Other circuits (not shown), such as other coupler designs, filters, switch matrices, corporate feed networks, and other types of passive signal carrying power circuits could also be implemented using the technology of the present invention, described more fully below in connection with FIGS. 3–7. The actual circuit design of these structures, i.e., the orientation and selection of the various passive components and associated component values, is within the knowledge of one of ordinary skill in this art, and therefore these circuits need not be described in detail.

FIG. 2 includes four ports, two input ports, labeled "I/P 1" (for Input Port 1) 32, and "I/P 2" 34, and two output ports, labeled "O/P 3" 52 and "O/P 4" 54. The four-port coupler 30 includes four shunt capacitors 38, 40, 46 and 48 of equal capacitance C1 pF connected between each of the ports 32, 34, 52 and 54 and analog ground 20, and four inductors 36, 42, 44 and 50. Inductors 36 and 50 are of equal inductance L2 and are connected, respectively, between the two input ports 32, 34, and the two output ports 52, 54. The other two inductors 42, 44 are also of equal inductance L1, which is preferably of a different value than L2, although they could be the same. These two inductors 42, 44 are connected, respectively, between input port 1 (IP 1) 32 and output port 4 (I/P 4) 54, and input port 2 (I/P 2) 34 and output port 3 (O/P 3) 52.

Having described two exemplary lumped element circuits that can be implemented in the structure and according to the method of the present invention, the application now turns to the description of the design technique for creating a model of the stripline passive elements that constitute the coupler circuits 10, 30. The model enables the design of various passive components with certain elemental values so as to achieve the desired circuit characteristics, such as frequency response and isolation.

Circuit models and empirical expressions for the design of constituent lumped elements are known in the prior art. However, these models are valid only for lumped elements implemented in the open microstrip-type structure, and are primarily focused towards the GaAs MMIC applications. The present invention provides the first known attempt to model and characterize lumped elements in stripline like structures for RF or microwave signal transmission. The inventive model considers the influence of the top dielectric layer placed above the printed signal layer, as well as the top and bottom ground planes, in obtaining the required static elemental values for the various passive devices. (The inventive stripline "ground-signal-ground" structure is described more fully below.) For example, the lumped inductor element is modeled by determining the self-inductance of a strip of printed metallic line including the mutual inductances and the parasitic capacitances presented by the top and bottom ground planes in the ground-signal-ground structure. The lumped capacitor is modeled by considering the effect of the dielectric layers and the spacing between the signal layer and the upper and lower ground planes.

Figure 3A:
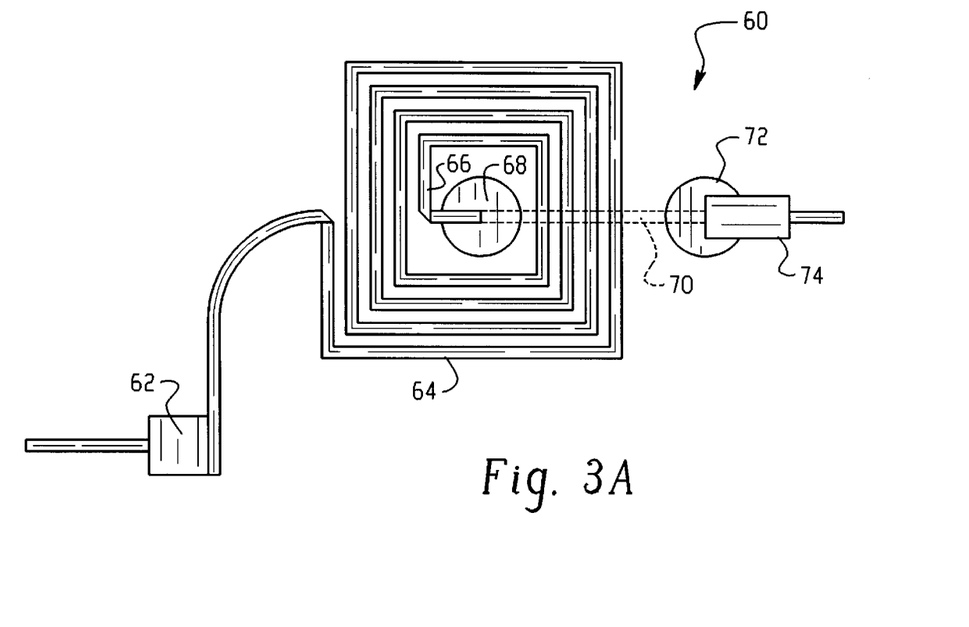
FIG. 3A is a printed lumped element spiral inductor according to the present invention.
Figure 3B:
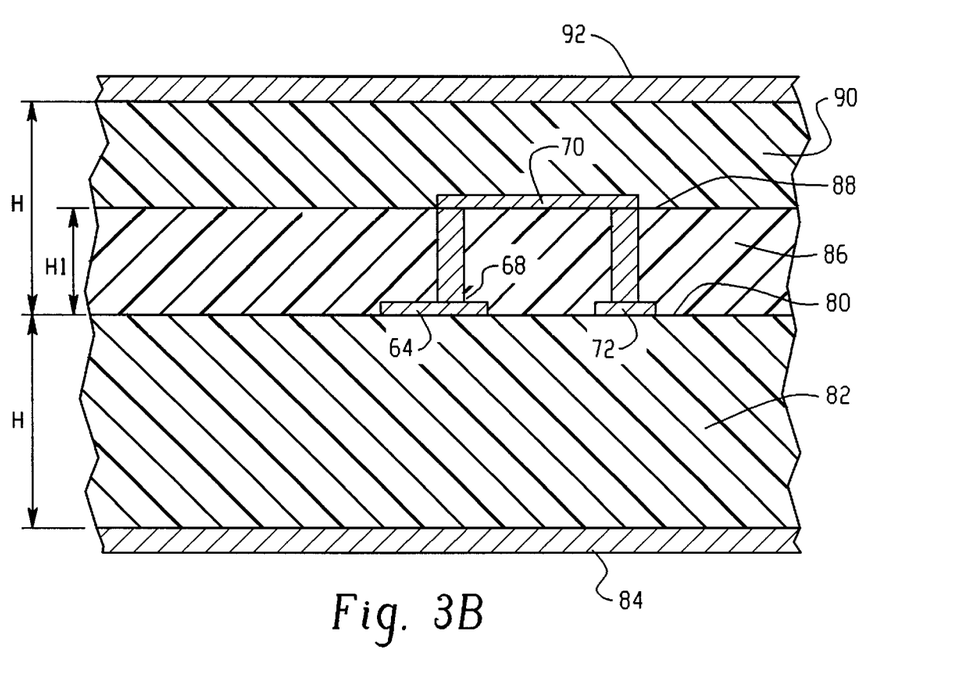
FIG. 3B is a cross-section of the printed lumped element spiral inductor implemented in the stripline structure of the present invention.

Turning now to the structure and method of the present invention, FIGS. 3A and 3B set forth, respectively, a printed lumped element spiral inductor implemented in stripline and a cross-section of the printed lumped element spiral inductor. FIG. 3A represents a printed spiral inductor 60. The required elemental value of the inductor 60 is obtained by appropriate selection of the line widths and spacings, the outer diameter of the spiral, and the number of turns. The preferred structure of the inductor 60 is a spiral, as shown in FIG. 3A, but could, alternatively be circular in shape instead of square, as shown. Other configurations could also be used.

The printed lumped element spiral inductor 60 consists of an input port 62, the printed spiral shape 64 including straight portions and several turns 66, a first connecting plated-thorough via hole 68, a dielectric bridge 70, a second connecting plated-through via hole 72, and finally an output port 74. The first connecting via hole 68 is metallized so it is conductive. The signal propagating though the inductor 60 is routed along the printed, metallized spiral pattern 64 up through the first connecting via 68 to the top of an adjacent laminated dielectric that has a metallized dielectric bridge 70 formed on it. The dielectric bridge 70 routes the signal over the spiral 64 to the second connecting plated-through via hole 72 and down to the signal layer and the output port 74.

FIG. 3B presents a cross-section of the inventive stripline structure showing the printed lumped element inductor 60. This figure shows the multi-layer stack up required to form the inductor. The structure consists of a first dielectric layer 82 having a certain dielectric constant ($\epsilon_r$) with a ground plane 84 below the first dielectric layer 82 and a signal carrying layer 80 on top. The method of making this structure is described in more detail below in connection with FIG. 5B. The signal carrying layer 80 is where the printed lumped element inductor 60 is formed. The inductor spiral 64, first and second connecting plated-through vias 68 and 72, and the dielectric bridge 70 are shown in the cross-section.

On top of the signal layer 80 is a second dielectric layer 86, which is preferably of the same dielectric constant as the first layer, although, alternatively, different materials having different $\epsilon_r$ could be used. The second dielectric layer 86 is drilled to form the via holes 68, 72 that connect the spiral 64 to the output port 74 of the spiral inductor 60. The method of drilling these holes is described in more detail below in connection with FIG. 5B. On top of the second dielectric layer 86 is the dielectric bridge layer 88, which preferably is a metallized layer that is etched to form the dielectric bridge 70 that connects the two parts of the spiral inductor 60. On top of the bridge layer 88 is a third dielectric substrate 90, which is preferably the same material as the first two layers, but could, alternatively, be of a different material. Finally, on top of the third dielectric layer 90 is a second ground plane 92. The two ground planes 84, 92 are preferably spaced (H) equidistant from the signal carrying layer 80 where the printed lumped element 60 is formed. The ground plane spacing (H) for the spiral inductor is preferably large so as to reduce the capacitive reactance contribution between the signal 80 and ground planes 84, 92.

Figure 4A:
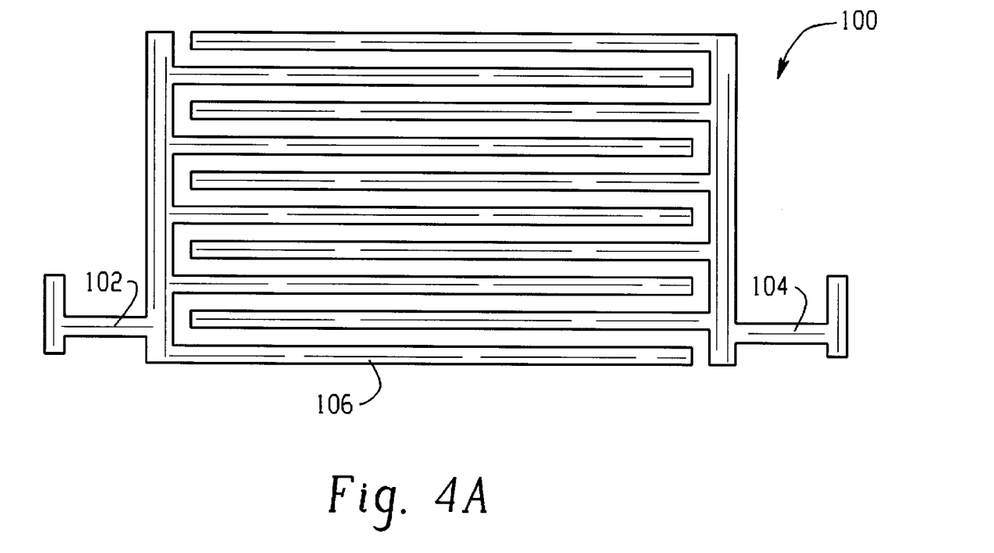
FIG. 4A is a printed lumped element interdigital capacitor according to the present invention.
Figure 4B:
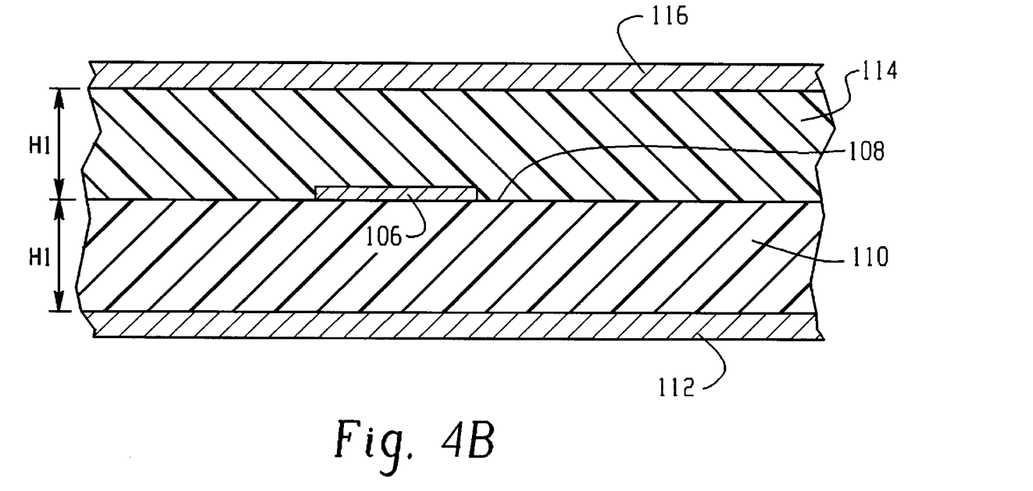
FIG. 4B is a cross-section of the printed lumped element interdigital capacitor implemented in the stripline structure of the present invention.

Turning now to FIGS. 4A and 4B, a printed lumped element interdigital capacitor 100 and a cross-section of the stripline implementation of the capacitor 100 are set forth, respectively. The stripline lumped element capacitor 100 consists of an input port 102, output port 104, and several interdigitated "fingers" 106, which are close to one another, but which do not touch each other. The modeled capacitance provided by the printed capacitor 100 is dependent on the number of fingers 106, the spacing between the signal layer 108 and the ground planes 112, 116 (as seen in FIG. 4B), and the width and spacing distance of the interdigital fingers 106.

FIG. 4B shows the stripline multi-layer structure of the printed lumped element capacitor 100. The structure consists of signal carrying layer 108, in which the capacitor 100 is printed, on top of a first dielectric substrate 110. On the bottom of the first dielectric layer 110 is a metallized ground plane 112. On top of the signal layer 108 is a second dielectric layer 114 and on top of the second layer is another ground plane 116. Like the printed spiral inductor of FIGS. 3A and 3B, the dielectric material used for the two substrates 110, 114 is preferably of the same $\epsilon_r$. However, the ground plane spacing (H1) for the capacitor, is preferably kept at a minimum distance and equidistant from the signal layer 108.

Figure 5A:
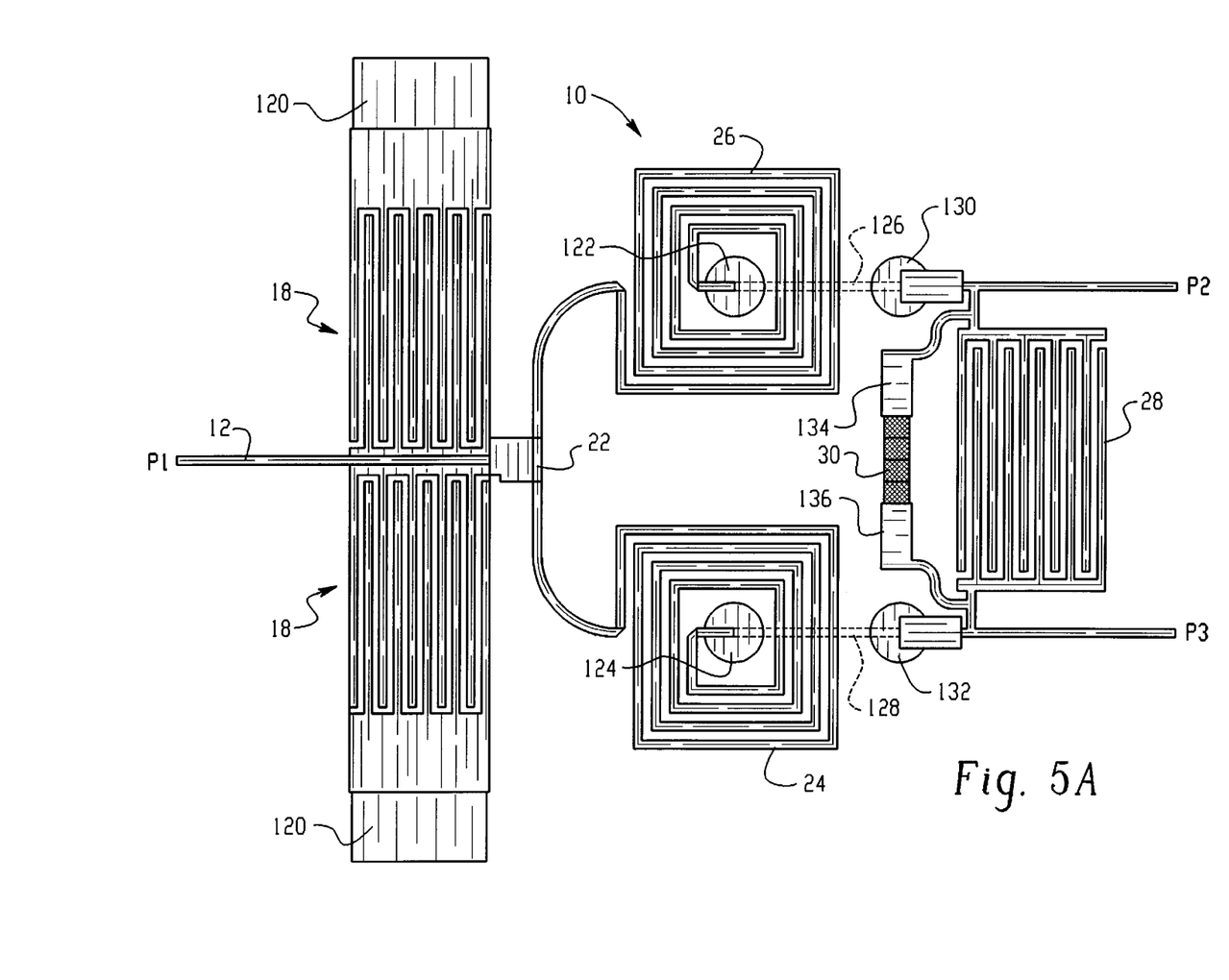
FIG. 5A is a printed lumped element three-port coupler according to the present invention.
Figure 5B:
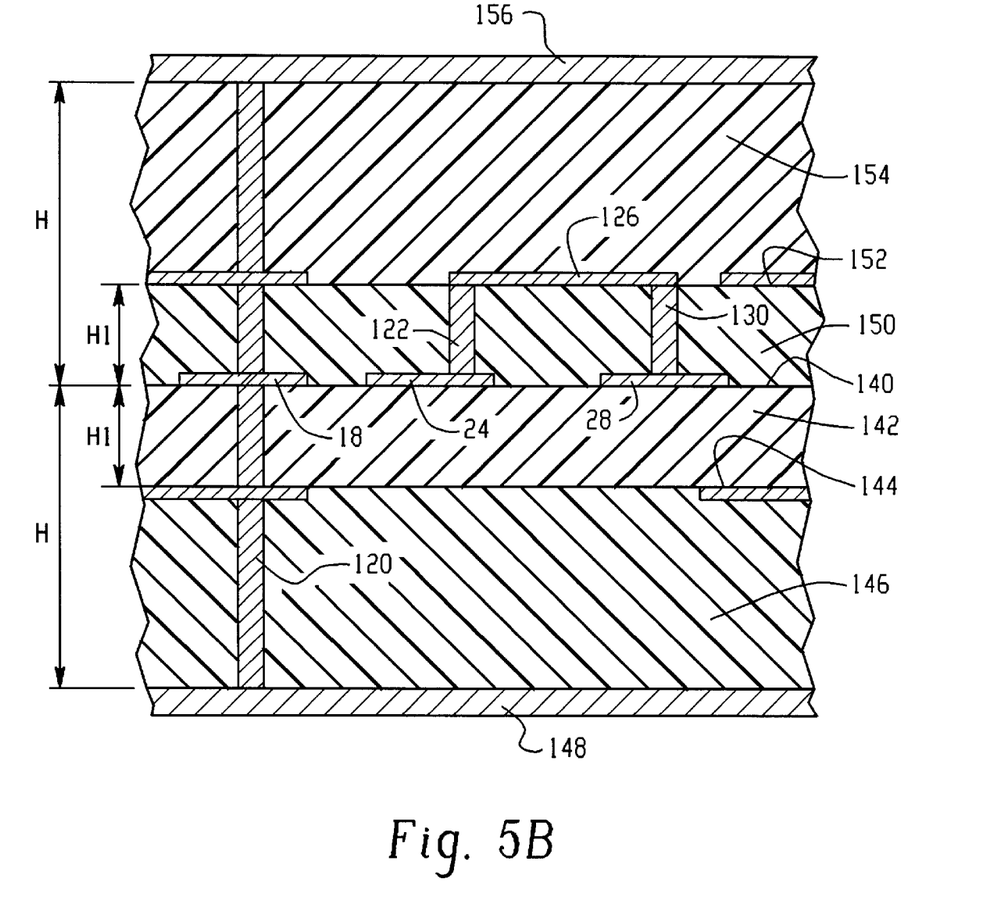
FIG. 5B is a cross-section of the printed lumped element three-port coupler implemented in the stripline structure of the present invention.

Having described two of the passive elements that can be created using the inventive structure and method of the present invention, the application now turns to the implementation and method of making the exemplary couplers from FIGS. 1 and 2 in a multi-layer stripline structure. FIG. 5A is a schematic of a printed lumped element three-port coupler, as set forth in FIG. 1. FIG. 5B is a cross-section of the printed lumped element three-port coupler implemented in stripline according to the method of the present invention.

Turning first to FIG. 5A, the −3 db three-port coupler is shown in printed lumped element form utilizing interdigital capacitors and spiral inductors, as described in FIGS. 3A, 3B, 4A and 4B. The coupler 10 includes an input port (P1) 12, and two output ports (P2) and (P3). The design includes shunt capacitors 18, spiral inductors 24, 26, and balancing network 28, 30, as described above in connection with FIG. 1.

The common input port (P1) 12 is connected to two shunt capacitors 18. The printed lumped element interdigital capacitors are connected between the input port (P1) 12 and analog ground 20 via plated through-hole vias 120. These two shunt capacitors 18 may be replaced by a single capacitor representing the modeled capacitance value for the shunt to ground. The construction of the capacitors 18 is similar to that described in FIGS. 4A, 4B. The capacitors 18 are followed by a TEE junction 22, the two side arms of which are connected to printed spiral inductors 24, 26, one inductor associated with each output port P2, P3. The construction of the spiral inductors is similar to that described in FIGS. 3A, 3B.

At the interior of each spiral inductor 24, 26 are first connecting plated-through via holes 122, 124, which route the splitted signals to the respective dielectric bridges 126, 128. The dielectric bridges 126, 128 are etched into an adjacent layer above the signal carrying layer where the rest of the components are printed. The dielectric bridges 126, 128 are then connected to second connecting plated-through via holes 130, 132, which route the signals back to the signal carrying layer where the components are printed.

The isolation and balancing network, consisting of capacitor 28 and printed resistor 30, is connected in parallel between the two output ports P2, P3. The resistor 30 is etched on a thin resistive film material, such as Omega Ply® material, or other such resistive material (e.g., nichrome (NiCr) or Tantalum Nitride, which can be sputtered or vacuum deposited onto the substrate), which has been laminated onto the first dielectric substrate on which the printed elements are formed. The resistivity of the Omega Ply® material is preferably 25 Ohms/square, although it could be selected to be a different value depending on the size and value of the resistor required. The required area of Omega Ply® material that has been modeled to represent the desired value of the resistor 30 is etched between two conductor pads 134, 136.

Referring now to FIG. 5B, a cross-section of the printed lumped element −3 db coupler is shown implemented in the stripline structure according to the present invention. The printed lumped elements that form the coupler, i.e., the capacitors 18, 28, inductors 24, 26 and resistor 30 are etched into a deposited or plated metallization signal layer 140. The dielectric bridges 126, 128 are similarly etched into metal deposited on an adjacent layer 152, separated from the signal layer 140 by a dielectric substrate 150.

The multi-layer stripline construction of the coupler 10 consists of four dielectric substrate layers, a first dielectric layer 142, a second dielectric layer 150 on top of the first, a third dielectric layer 154 on top of the second layer 150, and a fourth dielectric layer 146 below the first layer. Examples of the kinds of dielectric substrate materials that can be used with the present invention include Polyamide, FR4, RT Duroid 6006, RT Duroid 6010, AR600 and other PTFE based materials, to name a few. Those of skill in the art will recognize that other dielectric materials with similar properties to those mentioned could also be used. In the preferred structure shown in FIG. 5B, the dielectric constant ($\epsilon_r$) of each of the substrate layers 142, 146, 150 and 154 are equal, resulting in a homogeneous structure. The preferred value of $\epsilon_r$ ranges from 3 to 10.5, depending upon the desired value of the printed lumped elements, although other ranges could be utilized depending upon the particular power circuit to be implemented. In addition, different dielectric constants could be used for the different substrates in the multi-layer structure to provide a heterogenous implementation.

Also set forth in FIG. 5B is a signal carrying metal layer 140, and ground plane metal layers 144, 152, 148 and 156. The dielectric stack-up architecture of the present invention provides a signal carrying layer 140 sandwiched between two adjacent ground plane layers 144 and 152. The signal carrying layer 140 consists of the functional printed lumped element components of the desired circuit, e.g., capacitor 18, spiral inductor 24, and balancing capacitor 28. Ground plane layer 152 provides two functions—first, it provides the dielectric bridges 126, 128 required for the construction of the spiral inductors 24, 26; second, it provides the close ground plane spacing (H1) for the interdigital capacitors 18, 28.

Buried plated-through hole vias 122, 123, 130, and 132 are drilled into the second dielectric layer 150 and provide the interconnection between the two adjacent metal layers 140, 152. The ground plane layers 152, 144 do not cover the spiral inductors, only the interdigital capacitors. Additional ground plane layers 148, 156 are provided equi-distant (H) from the signal layer 140 and cover the entire circuit, including the spiral inductors and the interdigital capacitors. (Note that in FIG. 5B not all of the printed circuit elements of the coupler 10 are shown because the drawing is a cutaway through the center of the circuit and therefore certain elements cannot be detailed.)

FIG. 5B also shows the plated through-hole ground via 120 that connects the shunt capacitor 18 to one or more metallized ground planes 144, 152, 148 and 156. Although not shown in FIG. 5B, the implemented coupler 10 can be connected to by various means. For example, a via hole can be drilled and plated through so as to connect the input port (P1) 12 and the output ports (P2) and (P3) 14, 15 to adjacent layers where a connection can be made. Alternatively, the ports can be connected to a microstrip laminate and routed to additional circuitry using the prior art open microstrip techniques discussed in the Background section of this application.

The stripline structure of the present invention, an example of which is shown in FIG. 5B, is constructed according to the following method steps: (1) if a resistor is to be used with the circuit, such as balancing resistor 30, then the resistive material, which is preferably a resistive film material such as Omega Ply® is laminated onto the first dielectric substrate 142; (2) the first substrate 142 is then metallized on both sides by metal deposition, sputtering, or other metal application techniques; (3) a signal pattern is then printed on a top side of the first substrate 142 by etching away the metal other than the pattern that is to become the printed lumped element circuit—this forms the printed signal carrying layer 140; (4) a second dielectric substrate 150 is then laminated on top of the first 142 using glue, or other material that causes the two substrates 142, 150 to adhere to each other (the adhesive is preferably of the same dielectric constant as the substrate); (5) the via holes required for the circuit, such as ground via 120 and connecting vias 122, 130 are then drilled at appropriate positions into the second dielectric layer 150; (6) metal is deposited on top of the second layer and into the drilled via holes, forming the connecting plated-through vias; (7) a pattern is then printed on a top side of the second substrate 150 by etching away the metal other than the pattern that is to become the dielectric bridges 126, 128, and the area over the interdigital capacitors 18, 28—the metallization layer on the bottom side of the first substrate 142 is also etched to leave metal over the capacitors; (8) a third dielectric substrate 154 is then laminated on top of the second substrate 150 and a metallization layer is deposited on top of the third substrate; and finally, (9) a fourth dielectric substrate is laminated below the first substrate 142, and a final metallization layer 148 is deposited onto the fourth substrate. This method creates the stripline "ground-signal-ground" structure described above.

Additional via holes, such as ground via 120 can be formed by appropriately drilling holes into the substrates 146, 154 to extend the vias drilled in step (5). In addition, if any connections are to be established to the input or output ports of the coupler 10, then an associated via hole can be drilled and a pattern etched in the metallization layers to make a connecting pad. Although not shown explicitly in FIG. 5B, additional dielectric layers, metal layers and via holes can be formed by laminating additional substrates on top of and below the structure shown. FIG. 6B is an example of such a structure where additional dielectric layers are used to form additional interdigital capacitors in adjacent metal layers.

Figure 6A:
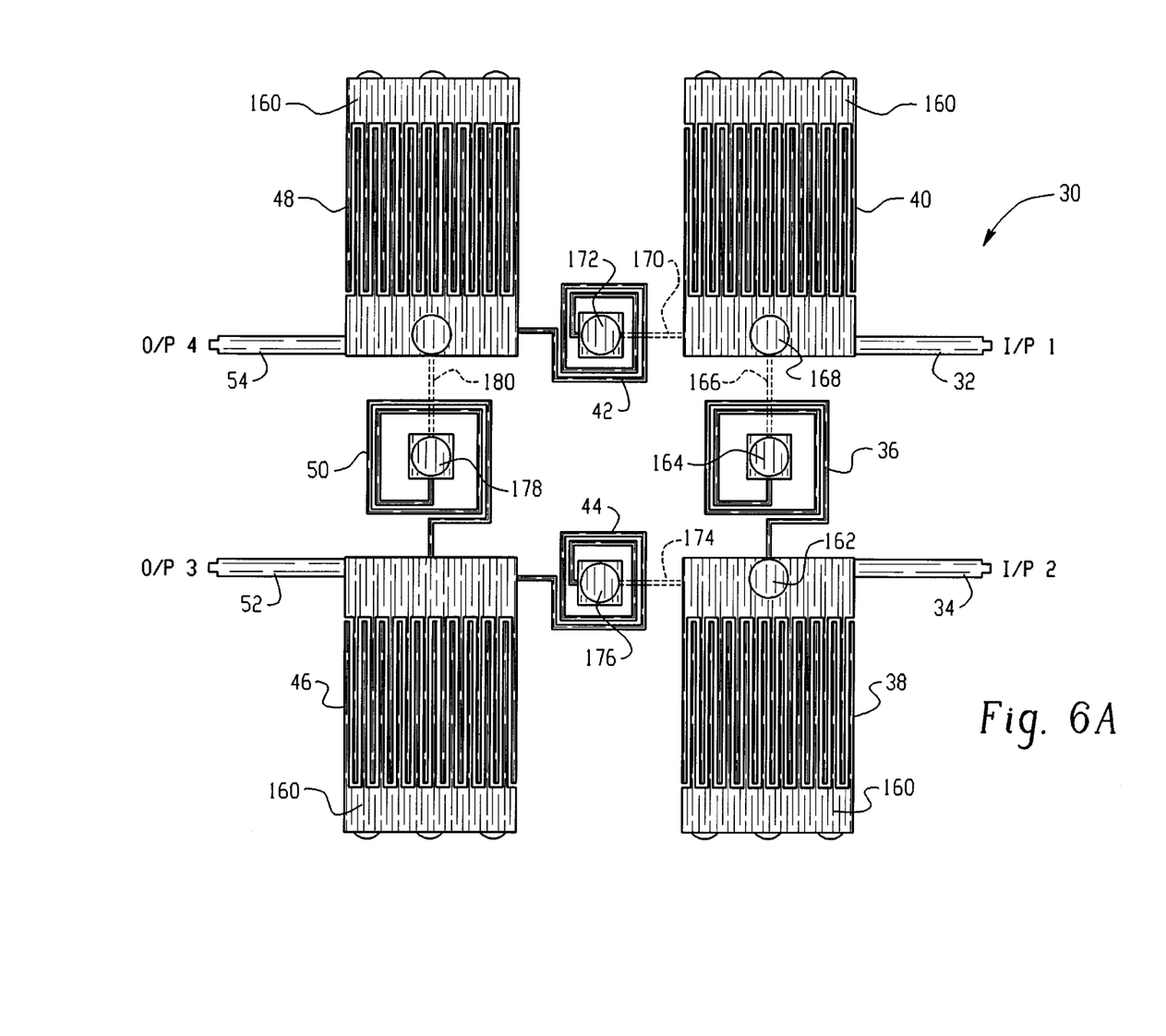
FIG. 6A is a printed lumped element four-port coupler according to the present invention.
Figure 6B:
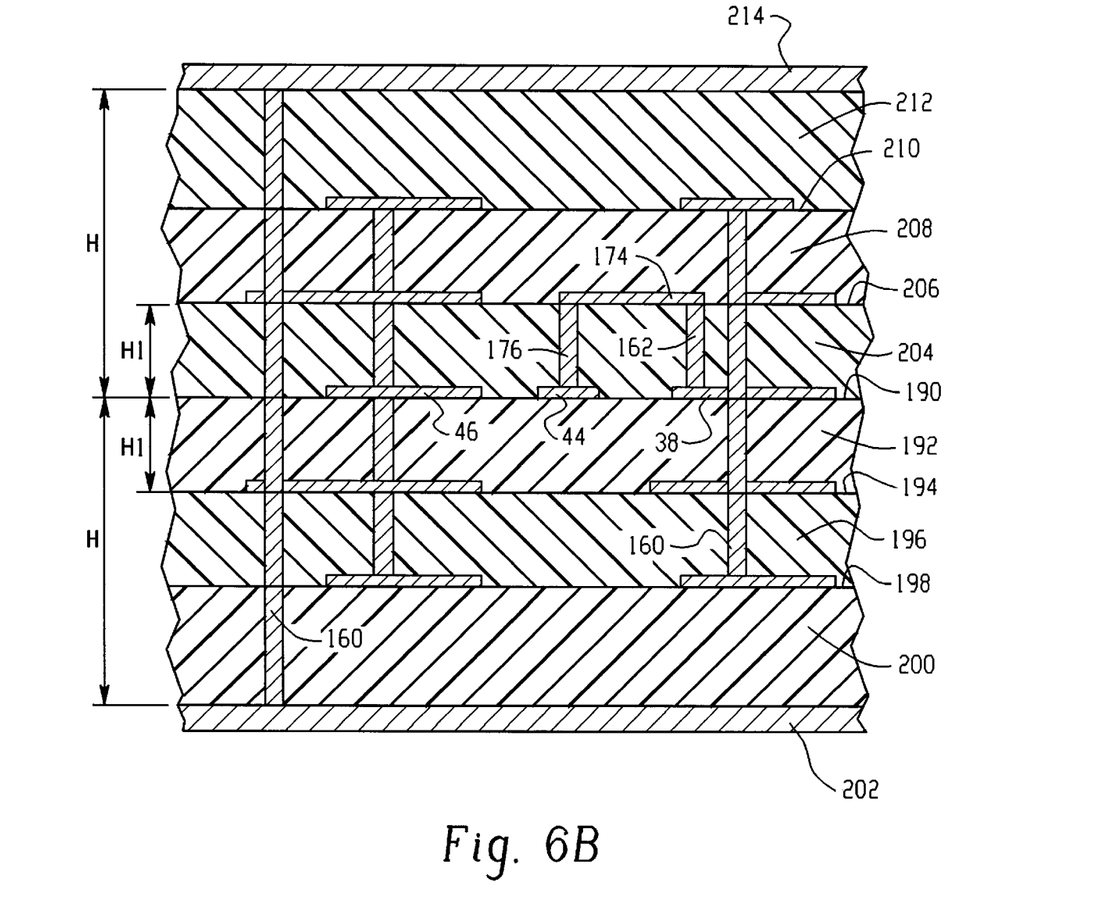
FIG. 6B is a cross-section of the printed lumped element four-port coupler implemented in the stripline structure of the present invention.

Turning now to FIGS. 6A and 6B, a printed lumped element four-port coupler according to the present invention is set forth along with a cross-section of the coupler implemented in stripline as detailed in the method steps above. FIG. 6A is a printed lumped-element version of the four-port coupler described in FIG. 2. This coupler 30 includes two input ports 32, 34 and two output ports 52, 54. Connected to each port is a shunt capacitor 38, 40, 46, and 48, represented as a printed lumped-element interdigital capacitor. Each capacitor is formed in accordance with the present invention, as described in connection with FIGS. 4A and 4B. The shunt capacitors are connected between the respective port and analog ground 20 through plated-through via holes 160.

The four-port coupler 30 also includes four spiral inductors 36, 42, 44 and 50 constructed according to the present invention as described in connection with FIGS. 3A and 3B. The first spiral inductor 36 is connected between input port 2 (I/P 2) 34 and input port 1 (I/P 1) 32. The inductor 36 includes a connecting plated-through via hole 164 at its center that connects to input port 1 (I/P 1) 32 via the dielectric bridge 166 and connecting plated-through via hole 168. Similarly, printed spiral inductors 42, 44 and 50 are connected between the respective ports shown in the drawing figure to form the circuit of FIG. 2. Each of these other spiral inductors has a centered connecting plated-through via hole 172, 176 and 178, and a respective dielectric bridge 170, 174 and 180.

FIG. 6B sets forth a cross-sectional view of the four-port coupler implemented using the stripline architecture and method of the present invention. The method of constructing this structure is the same as that employed in connection with the −3 db three-port coupler set forth in FIGS. 5A and 5B. The structure includes six dielectric substrates: a first substrate 192, a second substrate 204, a third substrate 208, a fourth substrate 212, a fifth substrate 196, and a sixth substrate 200; and also includes seven metallization layers: a signal carrying layer 190, a first ground layer 206, a second ground layer 194, a third ground layer 214, a fourth ground layer 202, a first element layer 210, and a second element layer 198.

The signal carrying metal layer 190, in which the printed lumped elements are formed, is etched on top of the first dielectric layer 192. The second dielectric layer 204 is then laminated on top of the first substrate 192, and the first ground layer 206 is formed on top of this second substrate 204. As describe above in connection with FIG. 5B, the first ground layer 206 serves two purposes, to form the dielectric bridges 174 that connect the spiral inductors 44 to the rest of the circuit, and to provide the closely spaced (H1) ground plane over the interdigital capacitors 38, 46. Prior to metallizing the top of the second substrate 204, the connecting via holes, such as 160, 176 and 162 are drilled so as to make the proper connections to the underlying printed circuit elements.

Additional substrates 196, 208 are then laminated onto the ground-signal-ground sandwich, and two elemental metal layers 210 and 198 are deposited on top of these additional substrates. The purpose of providing these additional substrates 196, 208 and metallization patterns 198, 210 is to provide additional circuit elements outside the plane of the signal carrying layer 190. In the example of FIG. 6B, additional capacitors are printed and etched into the element layers 198 and 210. These capacitors are connected in parallel with the interdigital capacitors 38, 40, 46, 48 formed in the signal carrying layer 190 to provide additional capacitance in a smaller surface area. These capacitors in the elemental layers 198, 210 are connected to the capacitors in the signal carrying layer 190 using plated through via holes, as shown.

Finally, the substrates 212, 200 are laminated onto the sandwich and additional ground plane metal is deposited on top of these substrates 202, 214. These outermost layers provide additional radiation blocking properties and also provide the metal layers over the interdigital capacitors formed in the elemental layers 210, 198. Although not shown explicitly in FIG. 6B, additional via holes, circuit elements, substrates and connections can be formed using the methods disclosed herein.

Figure 7B:
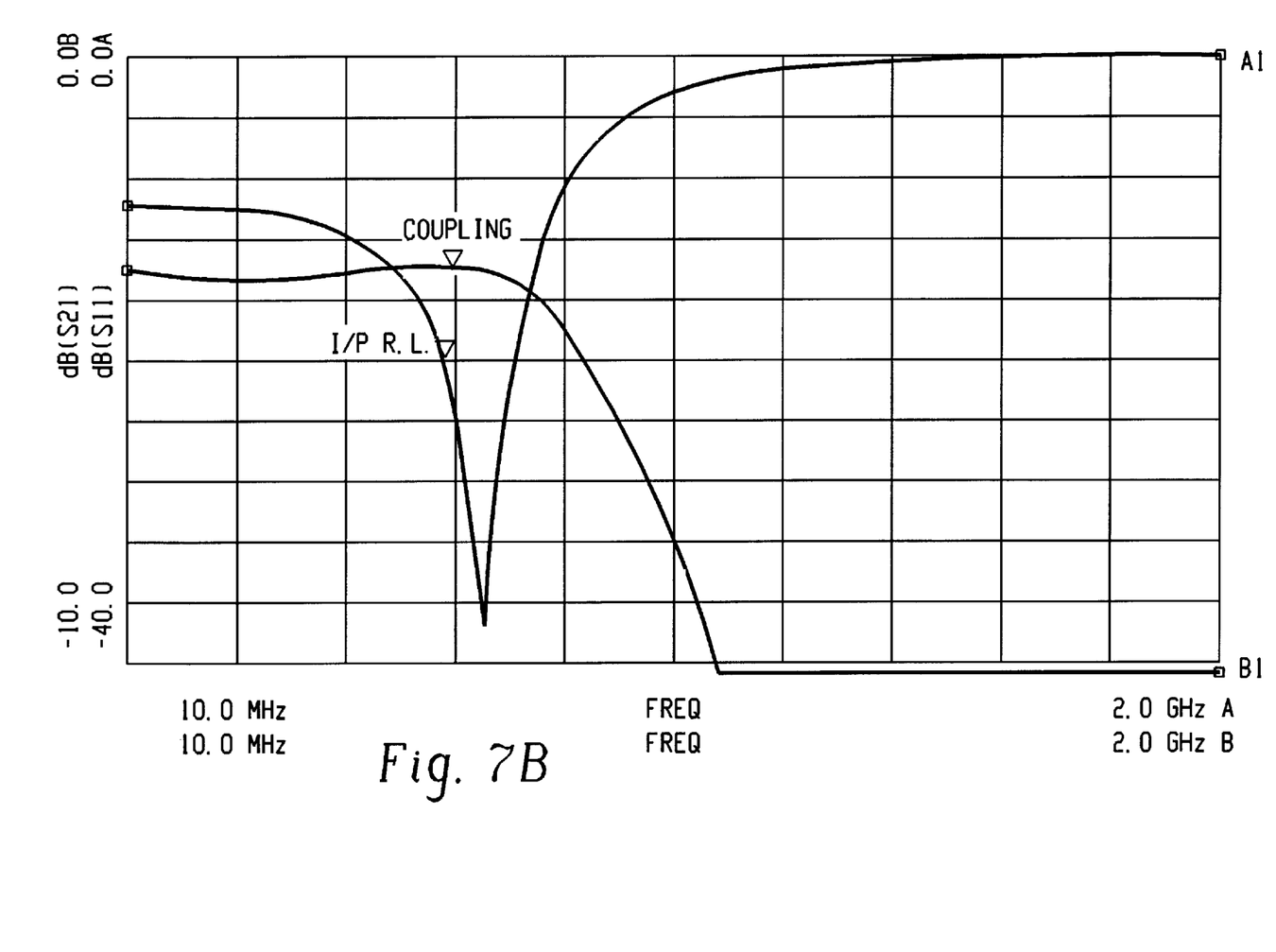
FIG. 7B is a plot of the frequency response of a printed lumped element stripline three-port coupler as described in FIG. 5A and 5B.

Turning finally to FIGS. 7A and 7B, frequency response plots of an ideal −3 dB three-port coupler is shown (FIG. 7A) next to the measured response from an implemented stripline −3 dB three-port coupler as described in the present invention and as set forth in FIGS. 5A and 5B (FIG. 7B). In FIG. 7A, the ideal frequency response and return loss is set forth for the circuit of FIG. 1. The frequency response is graphed as line 222, and the isolation return loss is line 220. The X-axis to measure frequency response is axis 226 and the X-axis to measure isolation return loss is 224. Likewise, the Y-axis to measure frequency response is 228 and the isolation return loss is 230. As seen in the ideal plot, the coupling from input to output is ideally about −3 db up to about 500 MHz, falling off smoothly as the frequency extends into the GHz range. The isolation return loss is greater than −40 dB.

As seen in FIG. 7B, the implemented stripline printed lumped element coupler from FIGS. 5A and 5B is very close to the ideal curve. The circuit couples at −3 db across the frequency range of interest, although it falls off more steeply than the ideal case, and the isolation return loss is better than −20 dB across the operating range.

Having described in detail the preferred embodiments of the present invention, including the preferred structure and implementation, it is to be understood that this structure and implementation could be carried out with different elements and steps. The preferred embodiments, including the particular circuits chosen as examples of the normal stripline lumped element approach of the present invention are presented only by way of example and are not meant to limit the scope of the present invention which is defined by the following claims.

What is claimed:

1. A stripline structure for implementing lumped element printed circuits having a ground-signal-ground architecture comprising:

a first dielectric substrate;

a signal carrying metal layer deposited onto the first substrate, in which a lumped element printed circuit is formed;

a second dielectric substrate laminated onto the first dielectric substrate;

a first ground plane deposited onto the first dielectric substrate on a side opposite the signal carrying metal layer; and a second ground plane deposited onto the second dielectric substrate on a side opposite the signal carrying metal layer, wherein the lumped element printed circuit is a four-port coupler.

2. A stripline structure for implementing lumped element printed circuits having a ground-signal-ground architecture comprising:

a first dielectric substrate;

a signal carrying metal layer deposited onto the first substrate, in which a lumped element printed circuit is formed;

a second dielectric substrate laminated onto the first dielectric substrate;

a first ground plane deposited onto the first dielectric substrate on a side opposite the signal carrying metal layer;

a second ground plane deposited onto the second dielectric substrate on a side opposite the signal carrying metal layer;

a third dielectric substrate laminated onto the second dielectric substrate; and a third ground plane deposited onto the third dielectric substrate on a side opposite the signal carrying metal layer.

3. The stripline structure of claim 2, further comprising:

a fourth dielectric substrate laminated onto the first dielectric substrate on a side opposite the second dielectric substrate; and a fourth ground plane deposited onto the fourth dielectric substrate on a side opposite the signal carrying metal layer.

4. The stripline structure of claim 3, further comprising:

a fifth dielectric substrate laminated between the second dielectric substrate and the third dielectric substrate; and a first metal element layer deposited at the interface between the fifth dielectric substrate and the third dielectric substrate on a side opposite the signal carrying metal layer.

5. The stripline structure of claim 4, further comprising:

a sixth dielectric substrate laminated between the first dielectric substrate and the fourth dielectric substrate; and a second metal element layer deposited at the interface between the sixth dielectric substrate and the fourth dielectric substrate on a side opposite the signal carrying metal layer.

6. The stripline structure of claim 4, wherein the first metal element layer includes printed lumped elements connected to elements printed on the signal carrying metal layer.

7. The stripline structure of claim 6, wherein the printed lumped elements on the first metal element layer are connected to elements printed on the signal carrying layer by plated through via holes drilled into the fifth dielectric substrate.

8. The stripline structure of claim 6, wherein the printed lumped elements on the first metal element layer includes interdigital capacitors.

9. A stripline structure for implementing lumped element printed circuits having a ground-signal-ground architecture comprising:

a first dielectric substrate;

a signal carrying metal layer deposited onto the first substrate, in which a lumped element printed circuit is formed;

a second dielectric substrate laminated onto the first dielectric substrate;

a first ground plane deposited onto the first dielectric substrate on a side opposite the signal carrying metal layer; and a second ground plane deposited onto the second dielectric substrate on a side opposite the signal carrying metal layer, wherein the lumped element printed circuit includes at least one printed interdigital capacitor.

10. The stripline structure of claim 9, where the printed interdigital capacitor comprises:

an input port;

an output port; and a plurality of interdigital fingers connected to the input and output ports.

11. A stripline structure for implementing lumped element printed circuits having a ground-signal-ground architecture comprising:

a first dielectric substrate;

a signal carrying metal layer deposited onto the first substrate, in which a lumped element printed circuit is formed;

a second dielectric substrate laminated onto the first dielectric substrate;

a first ground plane deposited onto the first dielectric substrate on a side opposite the signal carrying metal layer; and a second ground plane deposited onto the second dielectric substrate on a side opposite the signal carrying metal layer, wherein the lumped element printed circuit includes at least one resistor.

12. The stripline structure of claim 11, wherein the resistor is made of a resistive material that is laminated onto the first dielectric substrate.

13. The stripline structure of claim 12, wherein the resistive material is selected from the group consisting of: Omega-Ply®, nichrome and tantalum nitride.

14. A stripline structure for implementing lumped element printed circuits having a ground-signal-ground architecture comprising:

a first dielectric substrate;

a signal carrying metal layer deposited onto the first substrate, in which a lumped element printed circuit is formed;

a second dielectric substrate laminated onto the first dielectric substrate;

a first ground plane deposited onto the first dielectric substate on a side opposite the signal carrying metal layer; and a second ground plane deposited onto the second dieletric substate on a side opposite the signal carrying metal layer, wherein the lumped element printed circuit is a three-port coupler.

15. The stripline structure of claim 14, wherein the three-port coupler comprises:

an input port;

a shunt capacitor connected between the input port and analog ground;

a tee-junction that splits the signal at the input port into two paths;

at least two inductors, each inductor connected in series to one of the two paths;

a balancing and isolation network connected across the two paths; and at least two output ports, each output port connected to one of the two inductors.

16. The stripline structure of claim 15, wherein the balancing network comprises:

a resistor; and an interdigital capacitor.

17. The stripline structure of claim 15, wherein the shunt capacitor is an interdigital capacitor.

18. The stripline structure of claim 15, wherein the at least two inductors are spiral inductors.

19. A stripline structure for implementing lumped element printed circuits having a ground-signal-ground architecture comprising:

a first dielectric substrate;

a signal carrying metal layer deposited onto the first substrate, in which a lumped element printed circuit is formed;

a second dielectric substrate laminated onto the first dielectric substrate;

a first ground plane deposited onto the first dielectric substrate on a side opposite the signal carrying metal layer; and a second ground plane deposited onto the second dielectric substrate on a side opposite the signal carrying metal layer, wherein the second ground plane forms at least one dielectric bridge.

20. A stripline structure for implementing lumped element printed circuits having a ground-signal-ground architecture comprising:

a first dielectric substrate;

a signal carrying metal layer deposited onto the first substrate, in which a lumped element printed circuit is formed;

a second dielectric substrate laminated onto the first dielectric substrate;

a first ground plane deposited onto the first dielectric substrate on a side opposite the signal carrying metal layer;

a second ground plane deposited onto the second dielectric substrate on a side opposite the signal carrying metal layer, at least one connecting plated-through via hole drilled into the second dielectric substrate; and at least one dielectric bridge formed in the second ground plane and connected to at least one printed circuit element formed in the signal carrying layer by the connecting plated-through via hole.

21. A stripline structure for implementing lumped element printed circuits having a ground-signal-ground architecture comprising:

a first dielectric substrate;

a signal carrying metal layer deposited onto the first substrate, in which a lumped element printed circuit is formed;

a second dielectric substrate laminated onto the first dielectric substrate;

a first ground plane deposited onto the first dielectric substrate on a side opposite the signal carrying metal layer; and a second ground plane deposited onto the second dielectric substrate on a side opposite the signal carrying metal layer, wherein the first and second dielectric substrates are made of materials having different dielectric constants.

22. A stripline structure for implementing lumped element printed circuits having a ground-signal-ground architecture comprising:

a first dielectric substrate;

a signal carrying metal layer deposited onto the first substrate, in which a lumped element printed circuit is formed;

a second dielectric substrate laminated onto the first dielectric substrate;

a first ground plane deposited onto the first dielectric substrate on a side opposite the signal carrying metal layer; and a second ground plane deposited onto the second dielectric substrate on a side opposite the signal carrying metal layer, wherein the lumped element printed circuit includes at least one printed spiral inductor comprising:

an input port;

an output port;

a plurality of spiral arms connected to the input port;

a first connecting plated-through via hole connected to the spiral arms;

a dielectric bridge connected to the first connecting plated-through via hole; and a second connecting plated-through via hole connected between the dielectric bridge and the output port.

23. A stripline structure for implementing lumped element printed circuits having a ground-signal-ground architecture comprising:

a first dielectric substrate;

a signal carrying metal layer deposited onto the first substrate, in which a lumped element printed circuit is formed;

a second dielectric substrate laminated onto the first dielectric substrate;

a first ground plane deposited onto the first dielectric substrate on a side opposite the signal carrying metal layer; and a second ground plane deposited onto the second dielectric substrate on a side opposite the signal carrying metal layer, wherein the lumped element printed circuit operates over a frequency range of 200 MHZ to 4 GHz.

* * * * *